United States Patent
Tu et al.

[11] Patent Number: 6,008,106
[45] Date of Patent: Dec. 28, 1999

[54] MICRO-TRENCH OXIDATION BY USING ROUGH OXIDE MASK FOR FIELD ISOLATION

[75] Inventors: Tuby Tu, Miaoli; Chen Kuang-Chao, Hsinchu; Cheng-Tsung Ni, Hsinchu; Chih-Hsun Chu, Hsinchu, all of Taiwan

[73] Assignee: Mosel Vitelic Inc., Hsinchu, Taiwan

[21] Appl. No.: 08/915,693

[22] Filed: Aug. 21, 1997

[30] Foreign Application Priority Data

Jul. 15, 1997 [TW] Taiwan .................................. 86109965

[51] Int. Cl.⁶ ...................................................... H01L 21/76
[52] U.S. Cl. ............................................ 438/426; 438/444
[58] Field of Search ..................... 438/424–427, 438/432, 447, 254, 444

[56] References Cited

U.S. PATENT DOCUMENTS

| | | | |
|---|---|---|---|
| 5,292,689 | 3/1994 | Cronin et al. | 438/427 |
| 5,308,786 | 5/1994 | Lur et al. | 438/427 |
| 5,374,583 | 12/1994 | Lur et al. | 438/447 |
| 5,747,377 | 5/1998 | Wu | 438/444 |
| 5,756,389 | 5/1998 | Lim et al. | 438/425 |
| 5,879,988 | 3/1999 | Chen et al. | 438/254 |

*Primary Examiner*—Olik Chaudhuri
*Assistant Examiner*—Anh Duy Mai
*Attorney, Agent, or Firm*—Bacon & Thomas

[57] ABSTRACT

A method of forming isolation region of an integrated circuit by using rough oxide mask is described. First, a layer of first dielectric is formed on the surface of a silicon substrate. The first dielectric layer is then patterned to define active device region and isolation region. Next, a very thin layer of silicon dioxide is formed over the silicon substrate surface, followed by depositing a layer of rough oxide with proper grain size overlaying the silicon dioxide layer. By using rough oxide grains as an etching mask, the silicon dioxide layer and the silicon substrate underneath are spontaneously etched to form multiple trenches in the isolation region. Next, the rough oxide grains and silicon dioxide layers are stripped. Then, filed oxidation is performed to complete the field oxide isolation formation.

18 Claims, 2 Drawing Sheets

MICRO-TRENCH OXIDATION BY USING ROUGH OXIDE MASK FOR FIELD ISOLATION

BACKGROUND OF THE INVENTION

1. Field of the Invention

This invention relates generally to the field of integrated circuits fabrication, and more particularly, to a process of forming local field oxide isolation regions without bird's beak.

2. Description of the Prior Art

In the conventional integrated circuits fabrication, isolation is achieved by either local oxidation (LOCOS) or shallow trench isolation (STI). However, both are suffered from the so-called bird's beak formation which is caused by oxygen encroachment into the active regions during the oxidation. Referring now to FIG. 1, it illustrates a typical bird's beak region 14 at the areas where the field oxide 12 is adjacent to the active regions of the silicon substrate 10. These bird's beak regions cause problems in subsequent processing particularly as the allowable dimensional tolerances of the integrated circuits become smaller.

Within the prior art, there are some references addressing the bird's beak issue, however, none appears to be directed to the specific application of the present invention, namely the use of rough oxide mask to form multiple trenches for smoother field oxide growth.

For example, U.S. Pat. No. 5,374,583 to Lur et al. (the entire disclosure of which is herein incorporated by reference) discloses the use of aluminum—silicon alloy mask to etch a set of narrow trenches. Another paper titled "Nano-Trenched Local Oxidation of Silicon Isolation Using Island Polysilicon Grains" by Kwon et al., J. Electrochem. Soc., Vol. 143, No. 2, pp. 639–642, 1996, teaches the use of island polysilicon grains (IPG) mask. But the processes are too complicated and the materials are not often used in a semiconductor factory to be practically employed for integrated circuits mass-production.

SUMMARY OF THE INVENTION

Accordingly, it is a primary object of the present invention to provide a method of forming local isolation in an integrated circuit.

It is another object of the present invention to provide a method of forming local isolation by using rough oxide as a mask to reduce or eliminate the bird's beak formation.

Yet, another object of the present invention is to provide an effective and manufacturable method to locally oxidize silicon substrate for isolation in an integrated circuit.

These objects are accomplished by the fabrication process described below.

First, a layer of first dielectric is formed on the surface of a monocrystalline silicon substrate. The first dielectric layer is then patterned to define active device region and isolation region by the conventional lithography and etching techniques. Next, a very thin layer of second dielectric is deposited over the entire silicon substrate surface, followed by depositing a layer of rough oxide with predetermined grain size overlaying the second dielectric layer. Next step is the key point of the present invention, by using rough oxide grains as an etching mask, the second dielectric layer and the silicon substrate underneath are spontaneously etched to form multiple trenches in the isolation region. Next, the rough oxide grains and second dielectric layers are stripped. Then, field oxidation is performed to form a smoother field oxide isolation region. The local field oxide isolation regions without bird's beak according to the present invention is finally accomplished.

BRIEF DESCRIPTION OF THE DRAWINGS

The accompanying drawings forming a material part of this description, in which:

FIG. 8 illustrates the grain size of the rough oxide is a function of the ozone concentration according to the present invention.

DESCRIPTION OF THE PREFERRED EMBODIMENTS

Figure 1:
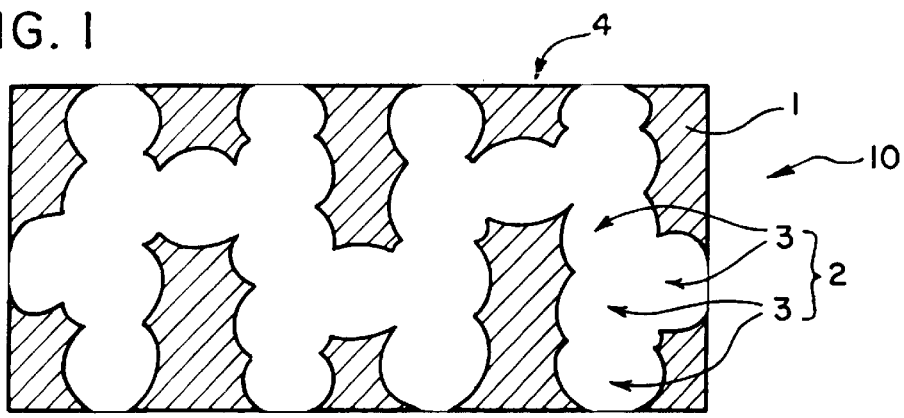
FIG. 1 shows a cross sectional representation of a field oxide region with bird's beaks formed by a conventional LOCOS process.

The invention discloses herein is directed to a process of forming local field oxide isolation regions without bird's beak. The drawing figures are illustrated a partially completed silicon substrate. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not to unnecessarily obscure the present invention.

Figure 2:
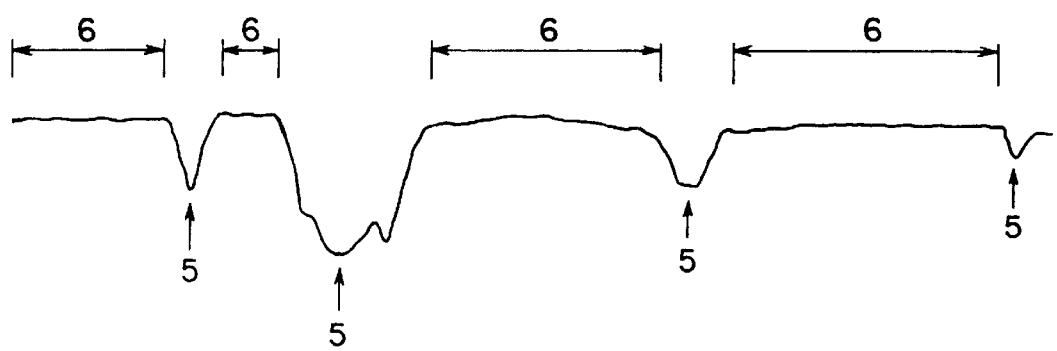
FIG. 2 shows a cross sectional representation of a silicon substrate after the isolation region is defined according to the first embodiment of the present invention.

Referring now more particularly to FIG. 2, a layer of first dielectric 23 is formed on the surface of a monocrystalline silicon substrate 21. The first dielectric layer 23 is then patterned to define active device region 25 and isolation region 27 by the conventional lithography and etching techniques.

The first dielectric layer 23 is thermally grown or chemically vapor deposited (CVD) silicon dioxide to a thickness of about 500 to 1000 Angstroms. Alternatively, the first dielectric layer 23 can be silicon nitride or silicon dioxide/silicon nitride double layers. The first dielectric layer etching process is using dry etching technique with $CF_4$, $CHF_3$ and $O_2$ reactant gases.

Figure 3:
FIG. 3 shows a cross sectional representation of a silicon substrate after the rough oxide is formed according to the first embodiment of the present invention.

Referring now to FIG. 3, a very thin layer of thermal oxide 29 which has a thickness of about 50 to 150 Angstroms is grown over the silicon substrate 21 surface in the isolation region 27, followed by depositing a layer of rough oxide 31 with predetermined grain size over the entire silicon substrate surface.

The rough oxide 31 is typically formed by atmosphere chemical vapor deposition (APCVD) or sub-atmosphere CVD (SACVD) techniques, the deposition operation is under a mixture of ozone and Tetra-Ethyl-Ortho Silicate (TEOS) gases ($O_3$-TEOS), at a temperature range of 300° C. to 600° C., a pressure range of 300 to 760 Torr and a ozone concentration greater than 4%. This step is the key point of the present invention, the surface roughness of the rough oxide is a function of ozone concentration as shown in FIG. 8. The rough oxides have ideal grain sizes which can serve as a proper etching mask when deposited in ozone concentration greater than 4% environment.

Figure 4:
FIG. 4 shows a cross sectional representation of a silicon substrate after multiple trenches are formed according to the first embodiment of the present invention.

Referring now to FIG. 4, by using rough oxide grains 31 as an etching mask, the thermal oxide 29A in the isolation region and the silicon substrate 21 underneath are spontaneously etched to form multiple trenches which are about 2000 to 4000 Angstroms deep. The etching process is once again using dry etching with $Cl_2$, HBr and $O_2$ reactant gases. Alternatively, the trenches 33 are formed by two-step etching to etch the thermal oxide 29A and the silicon substrate 21 separately.

Figure 5:
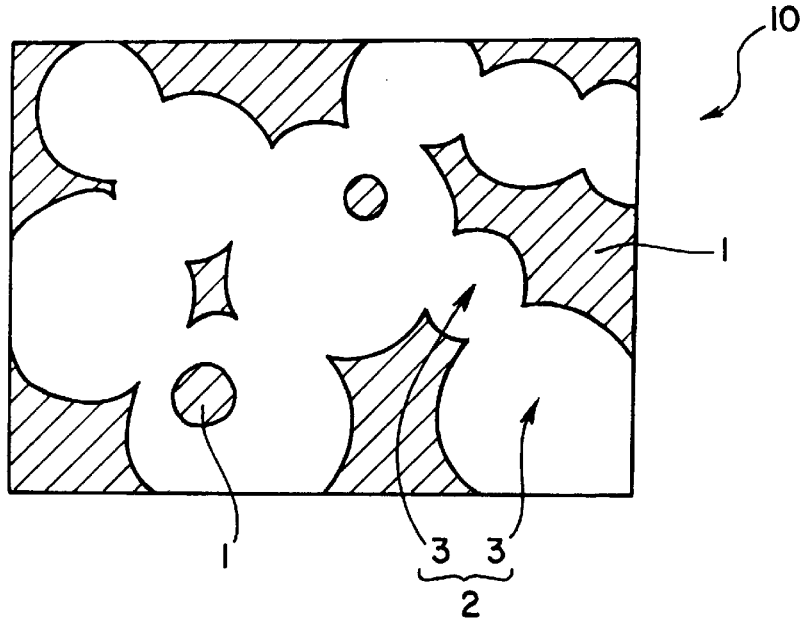
FIG. 5 shows a cross sectional representation of a silicon substrate after the isolation region without bird's beak is accomplished according to the present invention.

Referring now to FIG. 5, the rough oxide grains 31 and thermal oxide layer 29A are removed. Then, filed oxidation is performed to form a smoother field oxide isolation 37 without bird's beak. Alternatively, the field oxide 37 may first grow, and then remove the rough oxide grains 31 and thermal oxide layer 29A later. The local field oxide isolation regions without bird's beak according to the present invention is finally accomplished. Thereafter, the silicon substrate is ready for subsequent process steps.

The rough oxide grains 31 and thermal oxide layer 29A are usually stripped by diluted hydrogen fluoride (HF) acid, but other types wet etching or dry etching may also work. The field oxidation is achieved by thermally oxide the silicon substrate 21 at a temperature range of about 900° C. to 1100° C. for about 60 to 150 minutes to obtain an ideal field oxide thickness.

Alternatively, FIGS. 2, 5, 6, and 7 illustrate another preferred embodiment of the present invention. This embodiment proceed exactly as the proceeding embodiment up to the step of defining the active device and isolation regions.

Figure 6:
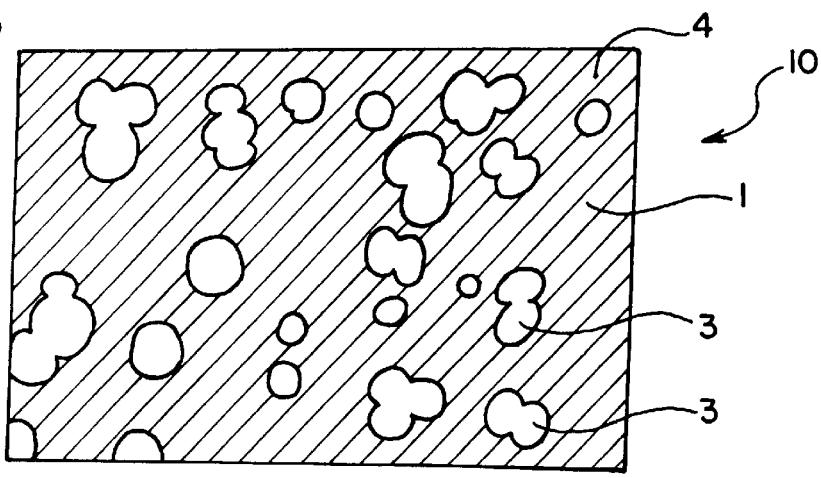
FIG. 6 shows a cross sectional representation of a silicon substrate after the rough oxide is formed according to the second embodiment of the present invention.

Referring now to FIG. 6, a very thin layer of second dielectric 30 which has a thickness of about 50 to 150 Angstroms is deposited over the entire silicon substrate 21 surface, followed by depositing a layer of rough oxide 31 with predetermined grain size overlaying the second dielectric layer 30 as shown in FIG. 6.

The second dielectric layer 30 is typically using chemical vapor deposited oxide (CVD oxide) or the like, alternatively, fluoride doped silicate glass (FSG), phosphor us doped silicate glass (PSG), plasma enhanced CVD TEOS (PE-TEOS), low pressure CVD TEOS (LP-TEOS), nitride ($Si_3N_4$) or oxynitride ($SiO_xN_y$) can also be used.

Figure 7:
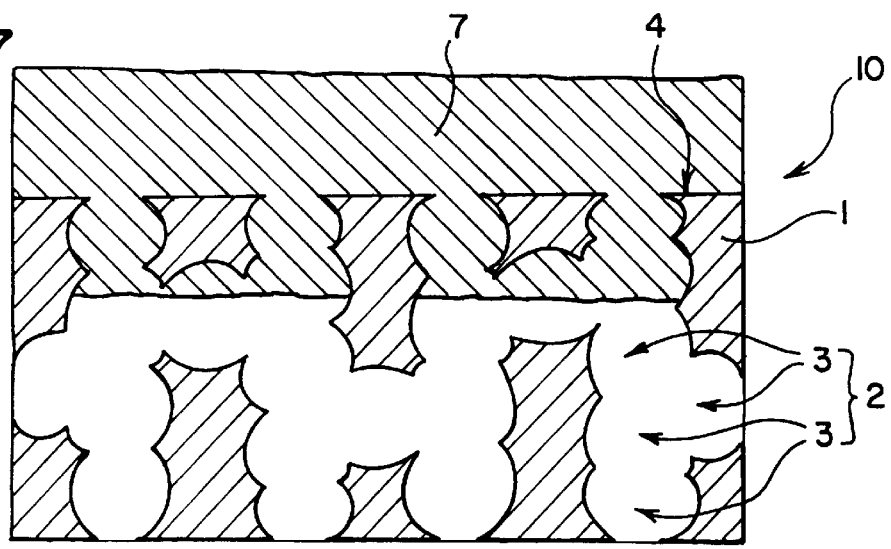
FIG. 7 shows a cross sectional representation of a silicon substrate after multiple trenches are formed according to the first embodiment of the present invention.

Referring now to FIG. 7, by using rough oxide grains 31 as an etching mask, the second dielectric layer 30A and the silicon substrate 21 underneath are spontaneously etched to form multiple trenches 33 about 2000 to 4000 Angstroms deep in the isolation region. The etching process is once again using dry etching with $Cl_2$, HBr and $O_2$ reactant gases. Alternatively, the trenches 33 are formed by two-step etching to etch the second dielectric layer 30A and the silicon substrate 21 separately.

Referring now to FIG. 5 once more, the rough oxide grains 31 and second dielectric layer 30A are stripped. Then, filed oxidation is performed to form a smoother field oxide isolation 37 without bird's beak. Alternatively, the field oxide 37 may first grow, and then strip the rough oxide grains 31 and second dielectric layer 30A later.

The field oxide isolation region formed according to the present invention has several advantages. First, the trenches provide deep oxide depth, and thereby high volume ratio and planar surface can be achieved. Besides, the enhanced trenches area also provides enough space for the silicon dioxide to expand, and results in smaller stress buildup and much less recessed bird's beak formation compared with the traditional LOCOS or STI processes.

While the invention has been particularly shown and described with reference to a preferred embodiment, it will be understood by those skilled in the art that various changes in form and detail may be made therein without departing from the spirit and scope of the present invention.

What is claimed is:

1. A method of forming isolation region of an integrated circuit by means of rough oxide mask, comprising the steps of (a) forming a first dielectric layer on a silicon substrate surface, and defining active device and isolation regions;

(b) growing a thermal oxide layer on the exposed said silicon substrate of the isolation region;

(c) forming a rough oxide layer over the entire silicon substrate surface;

(d) etching through said thermal oxide layer and silicon substrate to form multiple trenches in the isolation region by using said rough oxide as an etching mask; and (e) removing said rough oxide and thermal oxide layers, and then oxidizing said silicon substrate within said trenches to form a field oxide isolation region.

2. The method according to claim 1, wherein step (e) is first oxidizing said silicon substrate within said trenches to form a field oxide isolation region, and then removing said rough oxide and thermal oxide layers.

3. The method according to claim 1, wherein said first dielectric layer is selecting from the group consisting of silicon dioxide, nitride and oxide/nitride double layers.

4. The method according to claim 1, wherein said thermal oxide has a thickness of about 50 to 150 Angstroms.

5. The method according to claim 1, wherein said rough oxide is composed of silicon dioxide formed with reactant gases of ozone and Tetra-Ethyl-Ortho Silicate (O3-TEOS).

6. The method according to claim 5, wherein said $O_3$-TEOS is deposited in an environment with ozone concentration greater than 4%.

7. The method according to claim 5, wherein said $O_3$-TEOS is deposited at a temperature range between 300° C. to 600° C.

8. The method according to claim 5, wherein said $O_3$-TEOS is deposited at a pressure range between 300 to 760 Torr.

9. The method according to claim 5, wherein said trenches are about 2000 to 4000 Angstroms deep.

10. A method of forming isolation region of an integrated circuit by means of rough oxide mask, comprising the steps of:

(a) forming a first dielectric layer on a silicon substrate surface, and defining active device and isolation regions;

(b) depositing a second dielectric layer over the entire silicon substrate surface; wherein said second dielectric layer is selected the group consisting of chemical vapor deposited oxide (CVD oxide), fluoride doped silicate glass (FSG), phosphorous doped silicate glass (PSG), PE-TEOS, LP-TEOS, nitride and oxynitride;

(c) forming a rough oxide layer overlaying said second dielectric layer;

(d) etching through said second dielectric layer and silicon substrate to form multiple trenches in the isolation region by using said rough oxide as an etching mask; and (e) removing said rough oxide and second dielectric layers, and then oxidizing said silicon substrate within said trenches to form a field oxide isolation region.

11. The method according to claim 10, wherein step (e) is first oxidizing said silicon substrate within said trenches to form a field oxide isolation region, and then removing said rough oxide and second dielectric layer.

12. The method according to claim 10, wherein said first dielectric layer is selecting from the group consisting of silicon dioxide nitride and oxide/nitride double layers.

13. The method according to claim 10, wherein said second dielectric layer has a thickness of about 50 to 150 Angstroms.

14. The method according to claim 10, wherein said rough oxide is composed of silicon dioxide formed with reactant gases of ozone and Tetra-Ethyl-Ortho Silicate ($O_3$-TEOS).

15. The method according to claim 14, wherein said $O_3$-TEOS is deposited in an environment with ozone concentration greater than 4%.

16. The method according to claim 14, wherein said $O_3$-TEOS is deposited at a temperature range between 300° C. to 600° C.

17. The method according to claim 14, wherein said $O_3$-TEOS is deposited at a pressure range between 300 to 760 Torr.

18. The method according to claim 10, wherein said trenches are about 2000 to 4000 Angstroms deep.

* * * * *